(12) United States Patent
Hembacher et al.

(10) Patent No.: US 8,027,023 B2
(45) Date of Patent: Sep. 27, 2011

(54) OPTICAL IMAGING DEVICE AND METHOD FOR REDUCING DYNAMIC FLUCTUATIONS IN PRESSURE DIFFERENCE

(75) Inventors: Stefan Hembacher, Bobingen (DE); Bernhard Gellrich, Aalen (DE); Jens Kugler, Aalen (DE); Sascha Bleidistel, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 623 days.

(21) Appl. No.: 11/985,884

(22) Filed: Nov. 19, 2007

(65) Prior Publication Data

US 2008/0186467 A1 Aug. 7, 2008

Related U.S. Application Data

(63) Continuation-in-part of application No. 11/804,632, filed on May 18, 2007.

(30) Foreign Application Priority Data

May 19, 2006 (DE) .......................... 10 2006 023 876

(51) Int. Cl.
G03B 27/52 (2006.01)
G03B 27/42 (2006.01)
G03B 27/68 (2006.01)
G03B 27/60 (2006.01)

(52) U.S. Cl. ................. 355/55; 355/53; 355/52; 355/73

(58) Field of Classification Search .................... 355/53, 355/67, 55, 52, 73
See application file for complete search history.

(56) References Cited

U.S. PATENT DOCUMENTS

| | | | |
|---|---|---|---|
| 5,636,000 A | 6/1997 | Ushida et al. | |
| 6,002,987 A * | 12/1999 | Kamiya et al. | 702/56 |
| 6,043,863 A | 3/2000 | Ikeda | |
| 6,243,159 B1 | 6/2001 | Nakao | |
| 6,388,731 B1 | 5/2002 | Nakao | |
| 7,180,572 B2 | 2/2007 | Shih et al. | |
| 2002/0008861 A1 | 1/2002 | Singer et al. | |
| 2003/0020888 A1* | 1/2003 | Tanaka et al. | 355/30 |
| 2004/0179175 A1 | 9/2004 | Okada | |
| 2005/0018156 A1 | 1/2005 | Mulkens et al. | |
| 2005/0018160 A1 | 1/2005 | Dams et al. | |
| 2005/0179877 A1* | 8/2005 | Mulkens et al. | 355/30 |
| 2005/0263068 A1 | 12/2005 | Hoogendam et al. | |
| 2006/0066926 A1 | 3/2006 | Kwak et al. | |
| 2006/0092533 A1 | 5/2006 | Sogard | |
| 2006/0289794 A1* | 12/2006 | Furukawa et al. | 250/492.1 |
| 2008/0013063 A1 | 1/2008 | Hembacher et al. | |

(Continued)

FOREIGN PATENT DOCUMENTS

EP 1020897 7/2000

(Continued)

*Primary Examiner* — Edward Glick
*Assistant Examiner* — Deoram Persaud
(74) *Attorney, Agent, or Firm* — Fish & Richardson P.C.

(57) ABSTRACT

There is provided an optical imaging device, in particular for microlithography, comprising at least one optical element and at least one holding device associated to the optical element (109), wherein the holding device holds the optical element and a first part (109.1) of the optical element contacts a first atmosphere and a second part (109.2) of the optical element at least temporarily contacts a second atmosphere. There is provided a reduction device at least reducing dynamic fluctuations in the pressure difference between the first atmosphere and the second atmosphere.

22 Claims, 8 Drawing Sheets

U.S. PATENT DOCUMENTS

| | | | |
|---|---|---|---|
| 2008/0192222 A1* | 8/2008 | Okada | 355/67 |
| 2010/0149513 A1* | 6/2010 | Watson et al. | 355/72 |

FOREIGN PATENT DOCUMENTS

| | | |
|---|---|---|
| EP | 1 420 300 A2 | 5/2004 |
| EP | 1489462 | 12/2004 |
| EP | 1524558 | 4/2005 |
| JP | 02001905 | 1/1990 |
| JP | 2004-320016 | 11/2004 |
| WO | WO 2004/019128 A2 | 3/2004 |
| WO | WO 2005/106589 A1 | 11/2005 |
| WO | WO 2006/009573 | 1/2006 |
| WO | WO 2006/051689 A1 | 5/2006 |
| WO | WO 2006/080212 A1 | 8/2006 |
| WO | WO 2006/121008 A1 | 11/2006 |
| WO | WO 2006/126522 A1 | 11/2006 |

* cited by examiner

OPTICAL IMAGING DEVICE AND METHOD FOR REDUCING DYNAMIC FLUCTUATIONS IN PRESSURE DIFFERENCE

BACKGROUND OF THE INVENTION

The present invention relates to an optical imaging device. The invention may be used in the context of microlithography used for fabricating microelectronic circuits. Thus, it further relates to an optical imaging method which, among others, may be implemented using such an optical imaging device.

Especially in the area of microlithography, apart from the use of components having a high precision, it is necessary to keep the position and the geometry of the components of the imaging device, e.g. the optical elements such as lenses, mirrors and gratings, unchanged during operation to the highest possible extent in order to achieve a correspondingly high imaging quality. The tough requirements with respect to accuracy (lying in the magnitude of a few nanometers or below) are none the less a consequence of the permanent need to reduce the resolution of the optical systems used in fabricating microelectronic circuitry in order to push forward miniaturization of the microelectronic circuitry to be produced.

In order to achieve an increased resolution either the wavelength of light used may be reduced as it is the case with systems working in the extreme UV (EUV) range at working wavelengths in the area of 13 nm or the numerical aperture of the projection system used may be increased. One possibility to remarkably increase the numerical aperture above the value 1 is realized in so-called immersion systems, wherein an immersion medium having a refractive index larger than 1 is typically placed between the last optical element of the projection system and the substrate to be exposed. A further increase in the numerical aperture is possible with optical elements having a particularly high refractive index.

It will be appreciated that, in a so-called single immersion system, the immersion element (i.e. the optical element at least in part contacting the immersion medium in the immersed state) typically is the last optical element located closest to the substrate to be exposed. Here, the immersion medium typically contacts this last optical element and the substrate. In a so-called double immersion system, the immersion element does not necessarily have to be the last optical element, i.e. the optical element located closest to the substrate. In such double or multiple immersion systems, and immersion element may also be separated from the substrate by one or more further optical elements. In this case, the immersion medium the immersion element is at least partly immersed in may be placed, for example, between two optical elements of the optical system.

With the reduction of the working wavelength as well as with the increase of the numerical aperture not only the requirements with respect to the positioning accuracy and the dimensional accuracy of the optical elements used become more strict throughout the entire operation. Of course, the requirements with respect to the minimization of imaging errors of the entire optical arrangement increase as well.

The deformations of the respective optical element and the imaging errors resulting therefrom are of special importance in this context. Eventually, even the own weight of the optical elements leads to a non-tolerable deformation. In order to counteract these deformations induced by the own weight it is proposed in U.S. Pat. No. 6,243,159 B1 (Nakao) and in U.S. Pat. No. 6,388,731 B1 (Nakao)—the entire disclosure of each of which is enclosed herein by reference—to have atmospheres of different pressure acting on both sides on the optical element in such a manner that the pressure difference generates a counterforce corresponding to the gravitational force and acting on the optical element.

By this means it may be possible to achieve a high imaging quality, i.e. low imaging errors, in a stationary state. However, non-stationary factors leading to dynamic pressure variations in the atmosphere acting on the optical element still cause problems. Depending on the rigidity of the holder of the optical element such pressure variations may result in a shift of the respective optical element with respect to the remaining components of the imaging device leading to non-negligible imaging errors.

In order to counteract such pressure variation induced imaging errors with an optical element contacted by two different atmospheres U.S. Pat. No. 5,636,000 (Ushida et al.)—the entire disclosure of which is incorporated herein by reference—proposes to have adjustable optical correcting elements such as gratings or the like within the imaging device. Compensation of captured imaging errors as provided in this imaging device by adjusting the position of these optical correcting elements.

This solution has the disadvantage that it causes considerable expense for its development since the optical correction elements have to be considered in the outlay of the optical system and have to be integrated therein. Furthermore, typically, considerable expense is required for actuation of the optical correcting elements. Finally, eventually, the optical correcting elements themselves are a subject to the pressure variation such that the expense for the correction is increased.

BRIEF SUMMARY OF THE INVENTION

It is thus an object of the present invention to provide an optical imaging device and an optical imaging method, respectively, not showing the disadvantages outlined above or at least showing them to a lesser degree, and, in particular, with the use of an optical element being contacted by a first in a second atmosphere, allowing a simple manner the reduction of the effects of dynamic fluctuations in the pressure difference between the first atmosphere in the second atmosphere.

The present invention is based on the finding that a reduction of the effects of dynamic fluctuations (preferably above at least 1 Hz, in particular above 10 Hz) in the pressure difference between the first atmosphere of the second atmosphere may be achieved in a simple and reliable manner by reducing the cause itself, i.e. by reducing the fluctuations in the pressure difference between first atmosphere and the second atmosphere. It has been shown according to the invention that such a reduction of dynamic fluctuations in the pressure difference between the first atmosphere and the second atmosphere are achievable in an easy manner by corresponding measures and devices, respectively, which either, upon dynamic pressure fluctuations in one of the atmospheres, provide for a sufficiently rapid adaptation of the pressure, i.e. a following of the pressure, in the other atmosphere. In addition or as an alternative measures and devices, respectively, may be used reducing, in one of the both atmospheres, the occurrence of dynamic pressure fluctuations, their amplitude or their propagation up to the optical element.

The parts of the reduction device physically generating the dynamic adaptation of the pressure in the respective atmosphere or the reduction of the occurrence of dynamic pressure fluctuations, their amplitude or their propagation up to the optical element preferably a located as close as possible to the atmosphere or its part to be acted upon. Thus, a sufficiently rapid reaction to pressure disturbances may be achieved reducing or even preventing the propagation of such dynamic pressure disturbances up to the respective optical element.

It has been shown that such measures and devices, respectively, do not require further optical elements, i.e. an intervention to the optical system, such that the design of the optical system may, advantageously, remain unchanged. A further advantage lies in the reduction of the error arising during compensation since it is directly acted on the cause of the error itself.

The invention is further based on the finding that, for a given imaging device, typically, a corresponding pressure behavior model, in particular a pressure behavior model considering non-stationary or local pressure fluctuations, may be set up and used during active control of the dynamic pressure adaptation between both atmospheres. Using such a pressure behavior model an instrumentally particularly simple and rapid reacting control may be achieved.

An object of the present invention is thus an optical imaging device, in particular for microlithography, comprising at least one optical element and at least one holding device associated to the optical element, wherein the holding device holds the optical element and a first part of the optical element contacts a first atmosphere and a second part of the optical element at least temporarily contacts a second atmosphere. There is provided a reduction device at least reducing dynamic fluctuations in the pressure difference between the first atmosphere and the second atmosphere.

A further object of the present invention is an optical imaging method, in particular for microlithography, wherein a projection pattern is imaged onto a substrate using an optical imaging device, wherein a first part of an optical element of the optical imaging device contacts a first atmosphere and a second part of the optical element at least temporarily contacts a second atmosphere. For reducing an imaging error occurring during imaging the projection pattern onto the substrate and resulting from dynamic fluctuations in the pressure difference between the first atmosphere and the second atmosphere, at least a reduction of the dynamic fluctuations in the pressure difference between the first atmosphere and the second atmosphere is provided.

Further preferred embodiments of the invention become apparent from the dependent claims and the following description of preferred embodiments given with reference to the appended drawings, respectively. All combinations of the features disclosed, whether explicitly recited in the claims or not, are within the scope of the invention.

DETAILED DESCRIPTION OF THE INVENTION

First Embodiment

In the following, a first preferred embodiment of the optical imaging device for microlithography according to the invention will be described with reference to the FIGS. 1 to 5.

Figure 1:
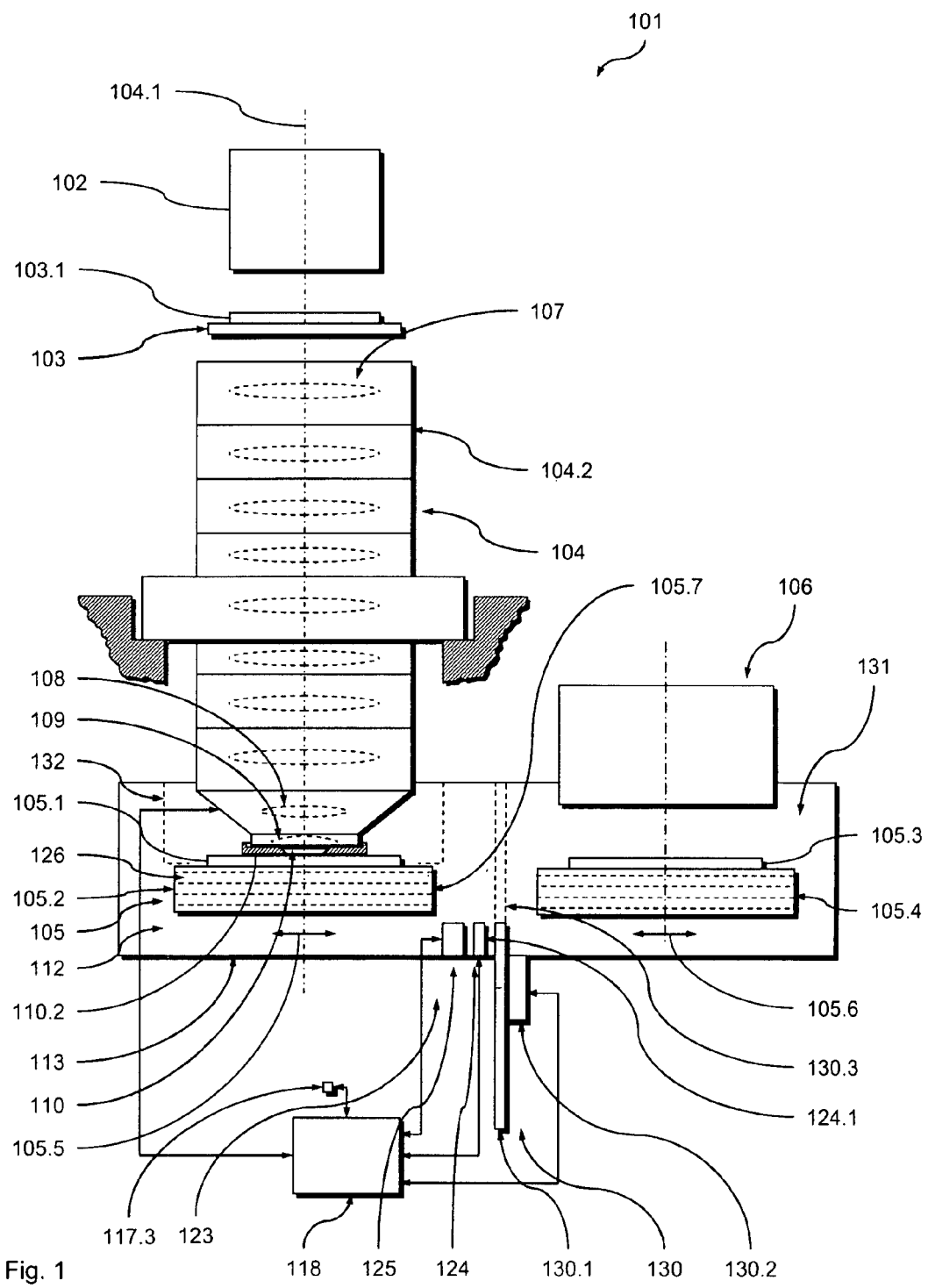
FIG. 1 is a schematic representation of a preferred embodiment of the optical imaging device according to the invention using which the preferred embodiment of the optical imaging method according to the invention may be executed.

FIG. 1 is a schematic representation of a preferred embodiment of the optical imaging device according to the invention in the form of a microlithography device 101 operating with light in the UV range having a wavelength of 193 nm.

The microlithography device 101 comprises an illumination system 102, a mask device with a mask table 103, an optical projection system in the form of an objective 104 having an optical axis 104.1 and a substrate device 105. The illumination system 102 illuminates a mask 103.1 arranged on the mask table 103 with a projection light beam—not shown in further detail—having a wavelength of 193 nm. A projection pattern is formed on the mask 104.3 which is projected by the projection light beam via the optical elements arranged within the objective 104 onto a substrate in the form of a first wafer 105.1 arranged on a first wafer table 105.2.

A measurement station 106 is located adjacent to the objective 104. The measurement station 106 serves to capture the topography of a second wafer 105.3 to be exposed subsequently to the first wafer 105.1 as it is known, for example, from EP 1 420 300 A2 (Lof et al.)—the disclosure of which is incorporated herein by reference. To this end, the second wafer 105.3 is arranged on a second wafer table 105.4 later being moved to the position of the first wafer table 105.2 shown in FIG. 1 for exposure of the second wafer 105.3.

The objective 104 comprises an optical element group 107 formed by a series of optical elements 108, 109. The optical elements 108, 109 are held within the housing 104.2 of the objective. Due to the working wavelength of 193 nm the optical elements 107 to 109 are refractive optical elements such as lenses or the like. Thereby, the last optical element 109 located closest to the wafer 105.1 during operation is a so called closing element or last lens element.

The microlithography device 101 is an immersion system. In an immersion zone 110, a liquid immersion medium 110.1, for example highly purified water or the like, is arranged between the wafer 105.1 and the last lens element 109. Within the immersion zone 110 there is provided an immersion bath of the immersion medium 110.1 on the one hand downwardly delimited at least by the part of the wafer 105.1 to be actually exposed. The lateral limitation on the immersion bath is provided at least partially by an immersion frame 110.2 (typically also called an immersion hood). At least the part of the last lens element 109 optically used during exposure and lying on the outer side of the objective 104 is immersed in the immersion bath such that the last lens element 109 is an immersion element in the sense of the present invention. Thus, the path of the light exiting from the last lens element 109 between the last lens element 109 and the wafer is located exclusively within the immersion medium 110.

Due to the refractive index of the immersion medium lying above the value 1 a numerical aperture NA>1 is achieved and the resolution is enhanced with respect to a conventional system with a gas atmosphere between the last lens element and the wafer.

The last lens element 109 (with its side 109.1 facing to the inner part of the housing 104.2) together with, among others, the housing 104.2 and the adjacent lens element 108 delimits a first space 111. Within the first space 111 a first atmosphere prevails contacting and acting on the last lens element 109. A first pressure P1 prevails within the first space 111.

The last lens element 109 (with its side 109.1 facing to the surroundings of the housing 104.2) together with, among others, the housing 104.2 and a housing 113 (into which the objective 104 protrudes) delimits a second space 112. Within the second space 112 a second atmosphere prevails contacting and acting on the last lens element 109. At least within the immersion medium 110.1 of the immersion bath a second pressure P2 prevails within the second space 112.

Depending on the outlay of the objective 104, a defined setpoint pressure difference DPS between the first pressure in the first atmosphere and the second pressure in the second atmosphere may be selected that is not equal to zero (DPS≠0). For example, a defined setpoint point pressure difference DPS may be provided causing a compensation of the weight of the last lens element 109 as is known from initially mentioned U.S. Pat. No. 6,243,159 B1 (Nakao) and U.S. Pat. No. 6,388,731 B1 (Nakao). However, it may also be provided that the setpoint pressure difference equals zero (DPS=0).

Fluctuations in the actual pressure difference DP between the first atmosphere in the second atmosphere, i.e. between the first pressure P1 and the second pressure P2 (DP=P1−P2) cause an alteration in the forces acting on the last lens element 109 in the direction of the optical axis 104.1 and, thus, cause (depending on the rigidity of the holding elements 114 connecting the last lens element 109 to the housing 104.2) a corresponding shift of the last lens element in the direction of the optical axis 104.1. This shift of the last lens element 109, in turn, causes an imaging error of corresponding magnitude.

The fluctuations in the actual pressure difference DP between the first atmosphere in the second atmosphere may stem from different sources. Motion of the comparatively large first wafer table 105.2 during the exposure process of the wafer 105.1 may generate pressure waves in the second atmosphere propagating up to the region of the last lens element 109. Likewise, motion of the comparatively large second wafer table 105.4 during the capturing process of the second wafer 105.1 may generate such pressure waves in the second atmosphere propagating up to the region of the last lens element 109. Rapid pressure changes may occur in the first atmosphere due to an active adjustment of the optical elements of the optical element group 107. In particular, upon an adjustment of the last lens element 109 or of the adjacent optical element 108, such rapid pressure changes may directly act on the last lens element 109. Likewise, pressure fluctuations in the respected atmosphere may be influenced or generated, respectively, by other factors, in particular by temperature changes or flow processes. Furthermore, such external pressure disturbances may stem from sources external to the microlithography device 101 such as the opening and closing of doors of the facility the microlithography device 101 is located in, turning on and/or off air showers in the cleanroom and even the flying by of a jet airplane or in the like causing pressure waves within the atmosphere surrounding the microlithography device 101 that might propagate towards the last optical element 109.

Figure 3A:
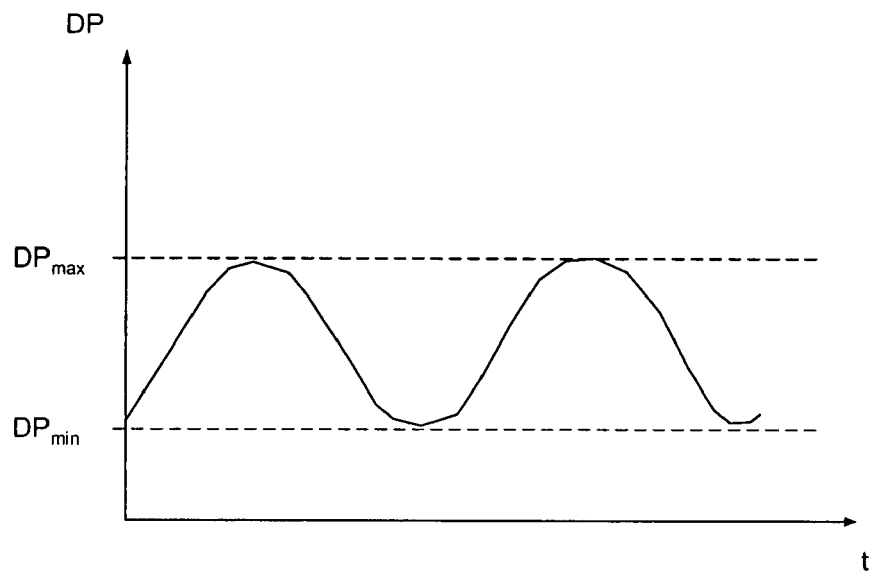
FIG. 3A is a schematic representation of a first example of the pressure difference DP between the first atmosphere and the second atmosphere in the optical imaging device of FIG. 1 as a function of time.
Figure 3B:
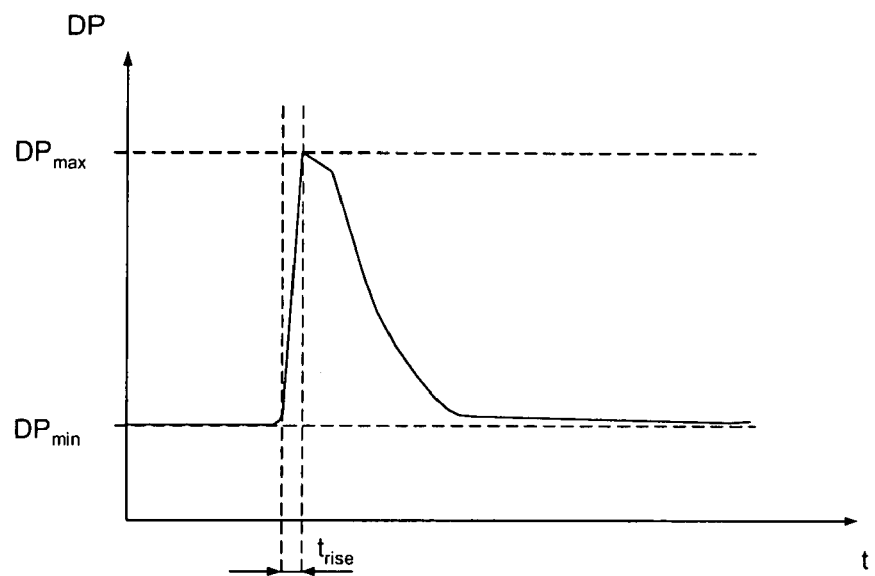
FIG. 3B is a schematic representation of a second example of the pressure difference DP between the first atmosphere and the second atmosphere in the optical imaging device of FIG. 1 as a function of time.

As may be seen from FIGS. 3A and 3B there are different types of dynamic pressure disturbances resulting in dynamic fluctuations within the pressure difference DP between the first atmosphere in the second atmosphere.

FIG. 3A shows the effect of dynamic periodic pressure disturbances leading to a dynamic periodic characteristic of the pressure difference DP between the first and second atmosphere. Such dynamic periodic pressure disturbances may for example result from the motion of the wafer tables 105.2 and 105.4 or any other regularly repeating event (e.g. a motion of a sufficiently large body or a generation of a sufficiently large flow of a medium) causing dynamic pressure alterations inside or outside the microlithography device 101. The frequency of such dynamic periodic pressure disturbances may reach up to 2 to 5 Hz, typically up to 1 to 2 Hz. The amplitude ($DP_{max} - DP_{min}$) of such dynamic periodic fluctuations in the pressure difference DP may reach up to 30 to 50 Pa, typically up to 15 to 30 Pa.

FIG. 3B shows the effect of a dynamic non-periodic pressure disturbance leading to a dynamic non-periodic characteristic of the pressure difference DP between the first and second atmosphere. Such dynamic non-periodic pressure disturbances may for example result from random motions within the microlithography device 101 and/or (more likely) outside the microlithography device 101. The rise time $t_{rise}$ of such dynamic non-periodic pressure disturbances (i.e. the time required for the pressure difference DP to reach its peak starting from its previous, typically normal level) may reach down to 20 ms and below, typically down to 10 ms, and in extreme cases down to 1 ms and even below. Thus, the frequency of such dynamic non-periodic pressure disturbances typically may reach up to 50 Hz to several 100 Hz. The amplitude ($DP_{max} - DP_{min}$) of such dynamic non-periodic fluctuations in the pressure difference DP may reach up to 30 to 50 Pa, typically up to 15 to 30 Pa.

In order to at least reduce such imaging errors due to dynamic temporal fluctuations in the actual pressure difference DP between the first atmosphere and the second atmosphere there is provided a reduction device 115 acting directly on the cause of these imaging errors, namely by at least reducing the dynamic fluctuations in the actual pressure difference between the first atmosphere in the second atmosphere. In the present example, the reduction device 115 comprises passive as well as active devices that will be explained in further detail in the following. It will be appreciated that each of the passive and active devices described in the following may be used either alone or in an arbitrary combination with other such devices.

A first active device 116 of the reduction device 115 comprises a first capturing device 117, a control device connected thereto and a first adjustment device 119. The first capturing device 117 captures the pressure difference deviation ΔDP of the actual pressure difference DP between the first atmosphere and the second atmosphere from the setpoint pressure difference DPS between the first atmosphere in the second atmosphere (ΔDP=DP−DPS). To this end, the first capturing device 117 comprises a first pressure capturing device 117.1 capturing the first pressure P1 in the first space 111 and a second pressure capturing device 117.2 capturing the second pressure P2 in the immersion medium 110.1 in the second space 112.

The first pressure capturing device 117.1 comprises one or more suitable pressure sensors capturing (with sufficient temporal and spatial resolution) the first pressure P1 and its distribution, respectively, in the first space 111 and provide corresponding signals to control device 118 connected thereto. The same applies to the second pressure capturing device 117.2 capturing (with sufficient temporal and spatial resolution) the second pressure P2 and its distribution, respectively, in the immersion medium 110.1 in the second space 112 and providing corresponding signals to the control device of 118 connected thereto. The second pressure capturing device, in particular, may be designed as the one known from U.S. 2005/0018156 A1 (Mulkens et al.)—the disclosure of which is incorporated herein by reference.

The first capturing device 117 further comprises a third pressure capturing device 117.3. The third pressure capturing device 117.3, again, comprises a plurality of suitable pressure sensors. Each of the pressure sensors of the third pressure capturing device 117.3 is located at least at a minimum distance L from the last lens element 109. The sensors of the third pressure capturing device 117.3 capture (with sufficient temporal and spatial resolution) the pressure and its distribution, respectively, in a space at a given distance from the last lens element 109 and provide corresponding signals to control device 118 connected thereto. As will be explained further below, the minimum distance L is selected as a function of the response time $t_{resp}$ of the control loop as well as of the maximum speed v of propagation of pressure events to be expected during normal operation of the microlithography device 101.

The third pressure capturing device 117.3, among others, serves to capture non-periodic pressure fluctuations resulting from random pressure events (as they have been outlined above) and propagating towards the last lens element 109. Given a defined location of the pressure sensors in relation to each other and in relation to the last lens element 109 the signals from the third pressure capturing device 117.3 may be used to establish the speed and direction of propagation of a pressure event and, thus, to establish the point in time when and to which extent a detected pressure event is going to reach the region of the last lens element 109.

To this end, eventually, the control device 118 may use a stored pressure behavior model of the microlithography device 101. The pressure behavior model may have been previously established (empirically and/or theoretically) and, among others, may represent the pressure response of the microlithography device 101 in the region of the last lens element as a function of the signals provided by the third pressure capturing device 117.3 and, eventually, further actual values of operating parameters of the microlithography device 101.

The first adjustment device 119 comprises a membrane 119.1 delimiting the first space 111 and being sealingly connected to the housing 104.2 at its outer circumference. The membrane 119.1 is connected to a linearly acting actuation device 119.2 by which the direction and the degree of the curvature of the membrane 119.1 and, hence, the volume of the first space 111 may be adjusted. In the embodiment shown in FIG. 2, the membrane 119.1 is made of a sheet of sufficiently compliant metal. However, it will be appreciated that, with other embodiments of the invention, compliance other membrane may be provided by other means, in particular via a suitable geometry, e.g. an undulating geometry. Furthermore, arbitrary other suitable materials or material combinations may be used for the membrane. For example, polymeric materials such as, for example, fluoropolymers (e.g. the fluoropolymers sold by DuPont under the name Viton®) may be used for the membrane.

From the signals of the pressure capturing devices 117.1, 117.2 and 117.3 the control device 118 establishes the pressure difference deviation ΔDP and generates therefrom corresponding first control signals for the first adjustment device 119. As a function of the first control signals the actuation device 119.2 adjusts the curvature of the membrane 119.1 and, hence, the volume of the first space 111. The control device 118 generates the first control signals in such a manner that the alteration of the volume of the first space 111 generated by the first adjustment device 119 causes an alteration of the pressure within the first space 111 counteracting the pressure difference deviation ΔDP. In other words, the first adjustment device 119—under the control of the control device 118—causes the first pressure P1 in the first space 111 to follow the second pressure P2 in the second space 112 in such a manner that the pressure difference deviations ΔDP are minimized or even eliminated in the ideal case.

Consideration of the signals from the third pressure capturing device 117.3 allows to take into account sharply rising and/or falling pressure disturbances the rise time $t_{rise}$ of which exceeds the response time $t_{resp}$ of a control only based on the signals provided by the second pressure capturing device 117.2. As mentioned above the minimum distance L of the pressure sensors of the third pressure capturing device 117.3 from the last lens element 109 is selected as a function of the response time $t_{resp}$ of the control loop (i.e. the minimum time necessary until the adjustment device 119, under the control of the control device 118, provides a reaction to a pressure event detected by the third pressure capturing device 117.3) as well as of the maximum speed of propagation $v_{prop}$ of pressure events to be expected during normal operation of the microlithography device 101. The minimum distance L may be calculated as:

$$L = v_{prop} \cdot t_{resp.} \qquad (1)$$

It will be appreciated that the control loop comprising the control device 118 and the first adjustment device 119 may provide a control bandwidth of about several 100 Hz. Thus, given a control bandwidth of about 100 Hz, i.e. a response time $t_{resp}$=10 ms, and a typical maximum speed of propagation $v_{prop}$ of pressure events between about 340 m/s and 1000 m/s a minimum distance L ranging between 3.4 m and 10 m would result.

Furthermore, it will be appreciated that the adjustment device 119 may be designed to have sufficient power over the entire control bandwidth in order to provide a sufficiently high alteration of the pressure P1 within the first space 111 in order to counteract pressure difference deviations ΔDP that result from sharply rising external non-periodic pressure events as they have been outlined above.

Figure 4A:
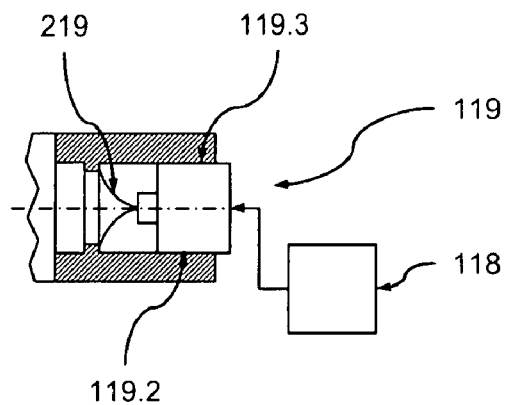
FIG. 4A to 4C each is a schematic partial section of a part of a further preferred embodiment of the optical imaging device according to the invention.

It will be appreciated that, with other embodiments of the invention, first adjustment devices of different design may be used for changing the volume of the first space. For example, instead of the rather rigid membrane 119 a rather soft membrane 219 may be used as it is shown in FIG. 4A (showing a part of a further embodiment of the microlithography device 101 in a view corresponding to the detail D of FIG. 2).

Figure 2:
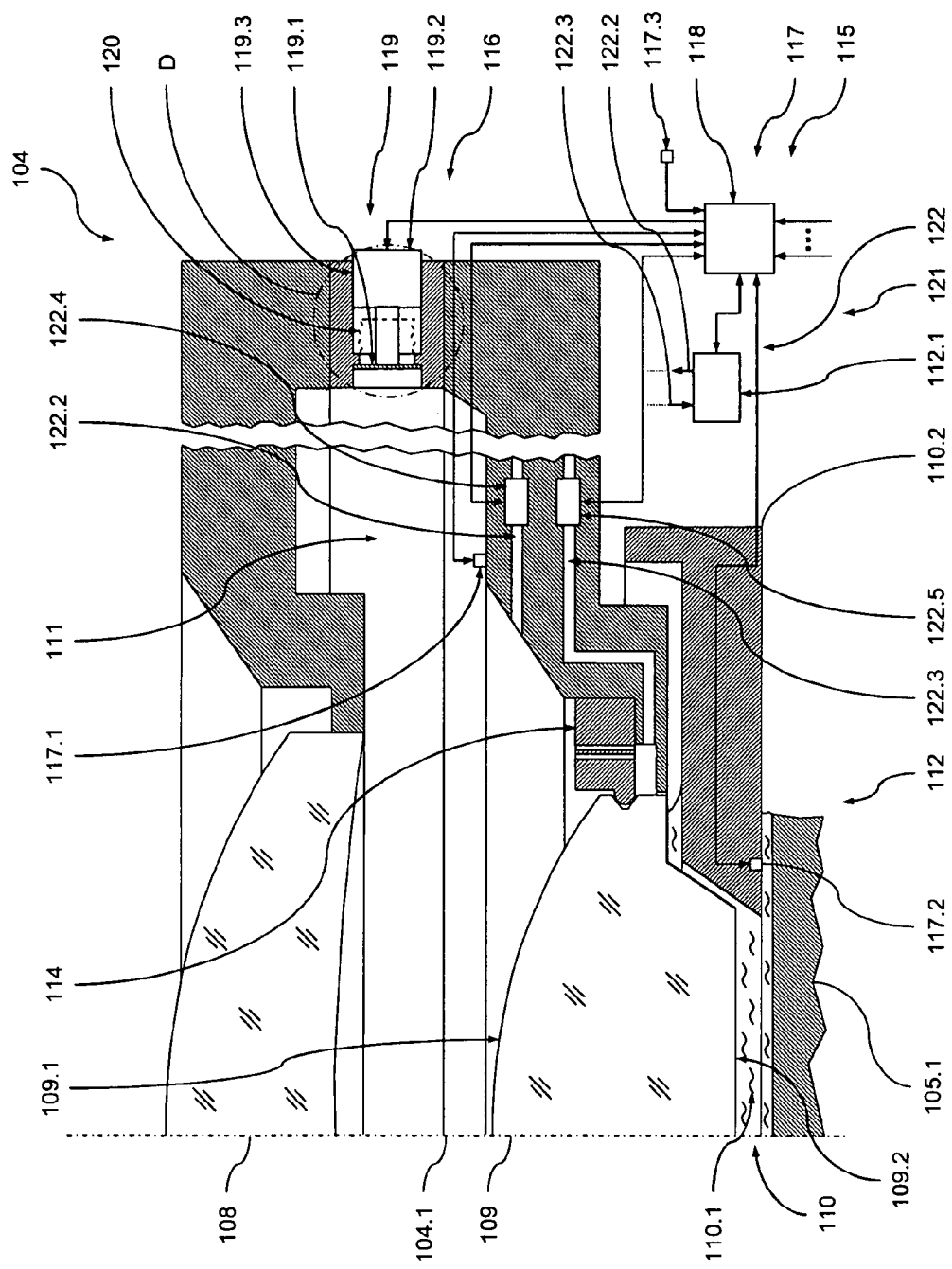
FIG. 2 is a schematic partial section of a part of the imaging device of FIG. 1.
Figure 4B:
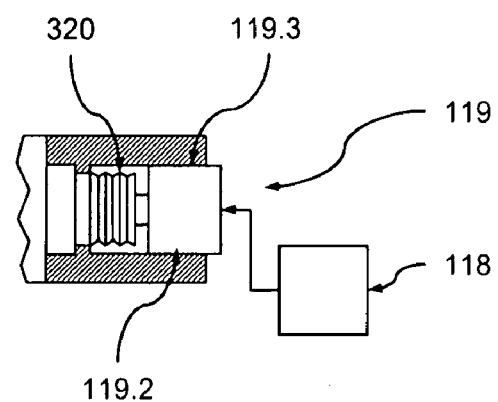

Instead of the membrane 119 of FIG. 2 a bellows may be used as it is indicated in FIG. 2 by the dashed contour 120 and also shown in FIG. 4B (showing a part of a further embodiment of the microlithography device 101 in a view corresponding to the detail D of FIG. 2) as the component 320. It will be appreciated that such a bellows 320, in relation to the membrane 119, due to its higher range of achievable excursion may provide higher alterations in the pressure P1 in the first space 111. With such a solution using a bellows 320 a control bandwidth of about several 100 Hz, typically at least about 100 to 400 Hz, is achievable.

Figure 4C:
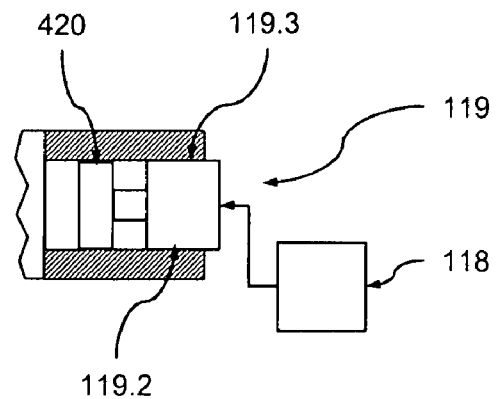

As a further alternative to the membrane 119 of FIG. 2 a simple piston 420 may be used as it is shown in FIG. 4C (showing a part of a further embodiment of the microlithography device 101 in a view corresponding to the detail D of FIG. 2). It will be appreciated that such a piston 420, in relation to the membrane 119, due to its higher range of achievable excursion as well may provide higher alterations in the pressure P1 in the first space 111. It will be further appreciated that the piston 420 does not necessarily have to be hermetically sealed against the cylinder it is running in. It may be sufficient that the gap between the cylinder and the piston 420 is sufficiently small such that an increase in the pressure P1 in the first space 111 is not immediately relieved via the gap. With such a solution using a piston 420 a control bandwidth in the order of several kHz, typically at least about 1 to 4 kHz, is achievable.

Likewise, the first adjustment device may be formed by an adjustment device using which the position of the lens element 108 and/or of the last lens element 109 may be modified, e.g. along the optical axis 104.1. For example, the holding elements 114 of the last lens element may comprise corresponding actuators which, under the control of the control device 118, modify the position of the last lens element 109. In this case it is preferred that the alteration of the imaging characteristic occurring due to the position alteration of the respective lens element is correspondingly accounted for by the control device 118. It will be appreciated that such a control loop comprising actuated optical elements, typically, provides a very high control bandwidth.

Finally, it will be appreciated that the adjustment devices mentioned in the foregoing may be provided in an arbitrary suitable number and/or combination.

As an alternative for an addition to the first active device 116 and active device 121 of the reduction device 115 may be provided. This active device 121 comprises the first capturing device 117, a control device 118 and an adjustment device in the form of a purging device 122. The purging device 122 comprises a delivery device 122.1 delivering a first mass flow of a purging medium to the first space 111 via a first line 122.2 and drawing off a second mass flow of the purging medium from the first space 111 via a second line 122.3. An adjustable valve 122.4 is provided within the first line 122.2 while a second adjustable valve 122.5 is provided within the second line 122.3.

Via the first adjustable valve 122.4 the mass flow of the purging medium provided to the first space 111 may be adjusted while via the second adjustable valve 122.5 the mass flow of the purging medium drawn off from the first space 111 may be adjusted. In addition or as an alternative in the mass flow delivered and drawn off, respectively, may also be adjusted via the delivery device 122.1 while the adjustable valves 122.4 and 122.5 may be missing in this case. Depending on the ratio between the mass flow delivered and the mass flow drawn off an alteration of the pressure within the first space 111 results.

From the signals of the pressure capturing devices 117.1 to 117.3 the control device 118 establishes the pressure difference deviation ΔDP and generates therefrom corresponding first control signals for the purging device 122. As a function of the first control signals the purging device 122, via the adjustable valves 122.4 and 122.5 and/or via the delivery device 122.1, adjusts the ratio between the mass flow delivered to the first space 111 and the mass flow drawn off from the . space 111 an alteration of the pressure within the first space 111 resulting therefrom. The control device 118 generates the first control signals in such a manner that the alteration of the pressure within the first space 111 generated by the purging device 122 counteracts the pressure difference deviation ΔDP. In other words, the purging device 122— under the control of the control device 118—causes the first pressure P1 in the first space 111 to follow the second pressure P2 in the second space 112 in such a manner that the pressure difference deviations ΔDP are minimized or even eliminated in the ideal case.

In case the adjustment device 119 and the purging device 122 are used in combination, in the control device 118, their respective effects are of course taken into account. In this case, in particular, it may be expedient to use the adjustment device 119 and the purging device 122 for the compensation of pressure difference deviations ΔDP with different frequency ranges. For example, it may be provided that the purging device compensates pressure difference deviations ΔDP in a first frequency range while the adjustments devices 119 compensates pressure difference deviations ΔDP in a second frequency range the frequencies of which are at least partially higher than the ones from the first frequency range. An overlap of the frequency ranges may be expedient to achieve a reliable compensation over the entire frequency span. It will be appreciated that the frequency span eventually only has to cover the frequency ranges in which non-negligible disturbances to the imaging quality of the microlithography device 101 are to be expected.

It will be appreciated that, with other embodiments of the invention, as an alternative or in addition to the alteration of the volume of the first space 111 and/or to the alteration of the effective mass flow within the first space 111, a corresponding alteration of the volume of the second space 112 and/or an alteration of the effective mass flow within the second space 112 may be provided.

A further active device 123 of the reduction device 115 comprises a second capturing device 124, the control device 118 and a second adjustment device 125. The second capturing device 124 captures pressure fluctuations in the second atmosphere, i.e. the pressure deviations ΔP2 in the second atmosphere from a setpoint pressure P2S (ΔP2=P2−P2S). To this end, the second capturing device 124 comprises a fourth pressure capturing device 124.1 capturing the pressure distribution P2 in the second space 112.

The fourth pressure capturing device 124.1 comprises one or more suitable pressure sensors capturing (with sufficient temporal and spatial resolution) the frequency and the amplitude of fluctuations of the second pressure P2, i.e. first pressure waves, in the second space 112 and provide corresponding signals to control device 118 connected thereto. In particular, the second pressure capturing device 117.2 described above may also be a component of the fourth pressure capturing device 124.1. Via the fourth pressure capturing device 124.1, in particular, first pressure waves are detected resulting from the motion of at least one of the two wafer tables 105.2, 105.4.

The second adjustment device 125 comprises one or more pressure wave generators generating (with sufficient temporal and spatial resolution) second pressure waves interfering with the first pressure waves captured via the third pressure capturing device 124.1

From the signals of the fourth pressure capturing device 124.1 and, eventually, (if present in combination) the signals from the third pressure capturing device 117.3, the control device 118 establishes the frequency and the amplitude of fluctuations of the pressure P2 within the second space 112 and generates therefrom corresponding second control signals for the second adjustment device 125. As a function of the second control signals, the pressure wave generators of the second adjustment device 125 generate second pressure waves in the second space 112. The control device 118 generates the second control signals in such a manner that the second pressure waves generated by the second adjustment device 125 interfere with the first pressure waves in such a manner that the pressure waves resulting from the interference at least have a lower amplitude. In the ideal case, the first and second pressure waves substantially eliminate each other.

In other words, via the active device 123, in an advantageous manner propagation of pressure disturbances within the second atmosphere towards the last lens element 109 are actively hindered or even prevented, respectively, such that there are no imaging errors resulting from such pressure disturbances. It will be appreciated that, with other embodiments of the invention, similar devices may also be provided and acting, respectively, in the first space 111. Furthermore, it will be appreciated that the control device 118 may control the motions of the two wafer tables 105.2 and 105.6 in a manner coordinated such that the respective first and second pressure waves resulting therefrom interfere with each other in such a manner that the pressure waves resulting from this interference at least have a lower amplitude. In the ideal case, the first and second pressure waves substantially eliminate each other.

It will be appreciated that arbitrary suitable sensors may be provided for capturing the pressure. In a gas atmosphere, for example, correspondingly suitable microphones may be used for capturing pressure fluctuations. Likewise, arbitrary suitable pressure wave generators may be provided. In a gas atmosphere, for example, correspondingly suitable loudspeakers or the like may be used as pressure wave generators.

Apart from the active devices 116, 121 and 123 of the reduction device 115 mentioned above, in the present example, further passive devices of the reduction device are provided also reducing fluctuations in the actual pressure difference DP between the first atmosphere and the second atmosphere.

As first passive devices, in both wafer tables 105.2 and 105.4, drag reduction devices in the form of flow channels 126 are provided. The flow channels 126 respectively extend the direction of motion 105.5 and 105.6 through the wafer table. Their effects will be explained in the following by means of example with reference to the first wafer table 105.1.

In the direction of motion 105.5, the flow channels 126 reduce the surface of attack 105.7 of the first wafer table 105.1 in relation to a reference body, i.e. a reference wafer table, having the same dimensions and a reference surface of attack that is substantially free from apertures, substantially planar and extends substantially perpendicular to the direction of motion 105.5. Upon a motion of the first wafer table 105 in the direction of motion 105.5, the gas of the second atmosphere of present in the region of the first wafer table 105.1 can flow through the flow channels 126 without substantial drag. In other words, the flow channels 126 reduce the drag coefficient of the first wafer table in the direction of motion 105.5. By this means, upon a motion on the first wafer table 105.2, pressure waves of lower amplitude are generated in relation to the reference wafer table as outlined above. Depending on the number and/or cross-section of the flow channels 126 a reduction of the drag coefficient of at least 30% may be achieved in relation to the reference wafer table.

Thus, in other words, by means of the flow channels 126, in an advantageous manner the generation and, hence, propagation of pressure disturbances in the second atmosphere up to the last lens element 109 is passively hindered such that a reduction of imaging errors resulting therefrom is achieved.

Figure 5A:
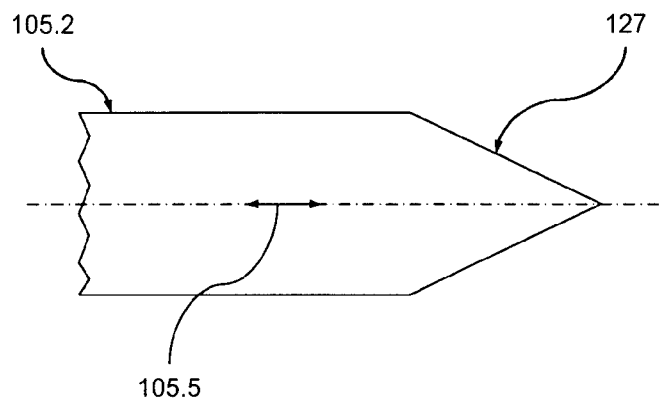
FIG. 5A to 5C each is a schematic partial section of a part of a further preferred embodiment of the optical imaging device according to the invention.
Figure 5B:
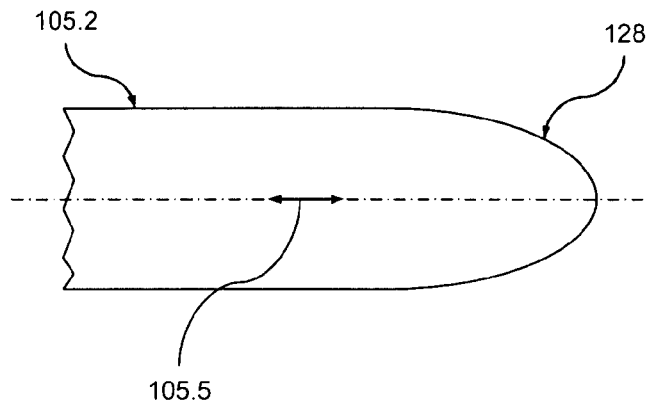

It will be appreciated that, with other embodiments of the invention, in addition or as an alternative to the flow channels 126 other drag reduction devices may be used. For example, at the lateral surfaces of the wafer table 105.2 facing in the direction of motion 105.5 profiles 127 and 128, respectively, (as they are shown in FIGS. 5A and 5B) may be provided for reducing the drag coefficient in relation to a reference wafer table. While the profile 127 is a comparatively simple triangular profile using which a reduction of the drag coefficient of at least 50% is achievable in relation to the reference wafer table, the profile 128 is an aerodynamically optimized profile using which a reduction of the drag coefficient of at least 80% is achievable in relation to the reference wafer table.

The profiles reducing the drag coefficient in relation to the reference wafer table may have an arbitrary suitable shape providing a corresponding reduction of the drag coefficient. In particular, they may have an asymmetric shape. Preferably, as with the profiles 127 and 128, a geometry asymmetric with respect to the direction of motion 105.5 is chosen in order to avoid lift effects and accompanying lateral pressure equalization between the upper side of the profiler and the lower side of the profile which otherwise could also generate further pressure disturbances.

Figure 5C:
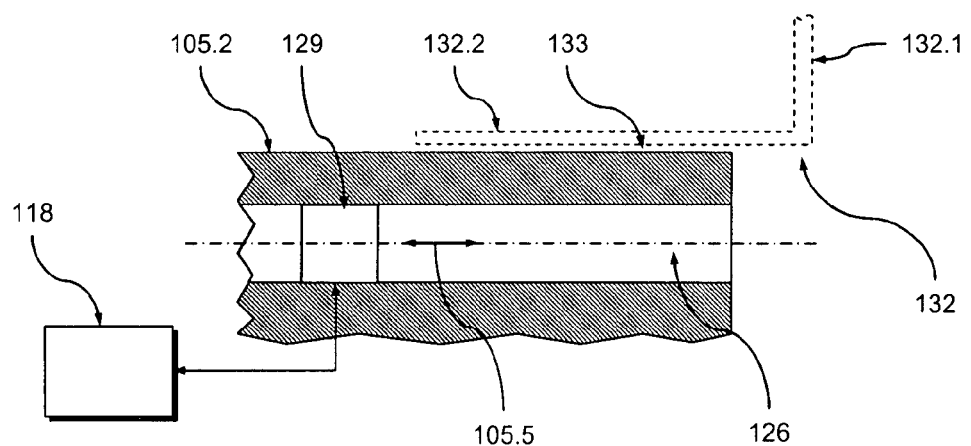

Furthermore, the passive drag reduction device of the flow channels 126 may be combined with an active component. As is shown in FIG. 5C, a delivery device 129, e.g. a fan etc, may be provided within the flow channel 126 and generating, as a function of the direction of motion of the wafer table 105.2, a corresponding flow within the flow channel 126 actively compensating the drag the gas experiences within the flow channel 126 and, thus, reducing the drag of the wafer table 105.2. The delivery device and 129 may, for example, be controlled by the control device 118 which in this case also provides motion control of the wafer table 105.2.

Finally, as a second passive device of the reduction device 115, a shielding device 130 is provided shielding the objective 104 and, hence, the last lens element 109 temporarily from the space of motion 131 of the second wafer table 105.4 during measuring in the measuring station 106.

The shielding device 130 comprises a partition 130.1 which may be moved—under the control of the control device 118—by a drive device 130.2 from the open position shown to a closed position indicated in FIG. 1 by the dashed contour 130.3.

In the open position of the shielding device 130 allows access from the space of motion 131 of the second wafer table 105.4 to the space of motion of the first wafer table 105.2 adjacent to the objective 104 such that the second wafer table 105.4 may be driven into the position of the first wafer table as soon as the second wafer 105.3 is to be exposed.

In the closed position the partition fully separates the space of motion 131 of the second wafer table 105.4 from the space into which the objective 104 protrudes. Thus, by means of the shielding device 130, in an advantageous manner propagation of pressure disturbances from the space of motion 131 of the second wafer table 105.4 up to the last lens element 109 is prevented such that a reduction of imaging errors resulting from such pressure disturbances is achieved.

It will be appreciated that, with other embodiments of the invention, no hermetic partition but only a hindrance of the propagation of pressure disturbances towards the last lens element by a shielding device may be provided. In this case, the partition preferably is provided with at least one vibration energy absorbing device, for example, a vibration absorbing surface.

Furthermore, as an additional or an alternative passive device on the reduction device 115, there may be provided a shielding device as it is indicated in FIGS. 1 and 5C by the dashed contour 132. The shielding device 132, in combination with the first wafer table 105.2, shields the objective 104 and, thus, the last lens element 109 temporarily from the space of motion 131 of the second wafer table 105.4 during measuring in the measuring station 106.

The shielding device 132 comprises a wall 132.1 surrounding the objective 104 in a ring shaped manner and having at its lower end a circumferential flange 132.2 pointing towards the objective 104. The flange 132.2 is arranged in such a manner that, during the exposure of the first wafer 105.1, there is always provided a narrow gap between the flange 132.2 and the first wafer table 105.2.

In the position shown in FIGS. 1 and 5C the shielding device 132 and the first wafer table 105.2 shield the space of motion 131 of the second wafer table 105.4 from the space delimited by the shielding device 132 and the first wafer table 105.2 into which the objective 104 protrudes. Only via the gap 133 pressure fluctuations caused, for example, by motions of the second wafer table 105.4 may propagate towards the objective 104. Depending on the width and length of the gap 133 this pressure fluctuations are correspondingly strongly attenuated. Thus, by means of the shielding device 132, propagation of pressure disturbances from the space of motion 131 of the second wafer table 105.4 up to the last lens element 109 are passively reduced or prevented, respectively, in an advantageous manner such that a reduction of imaging errors resulting from such pressure disturbances is achieved.

Figure 6:
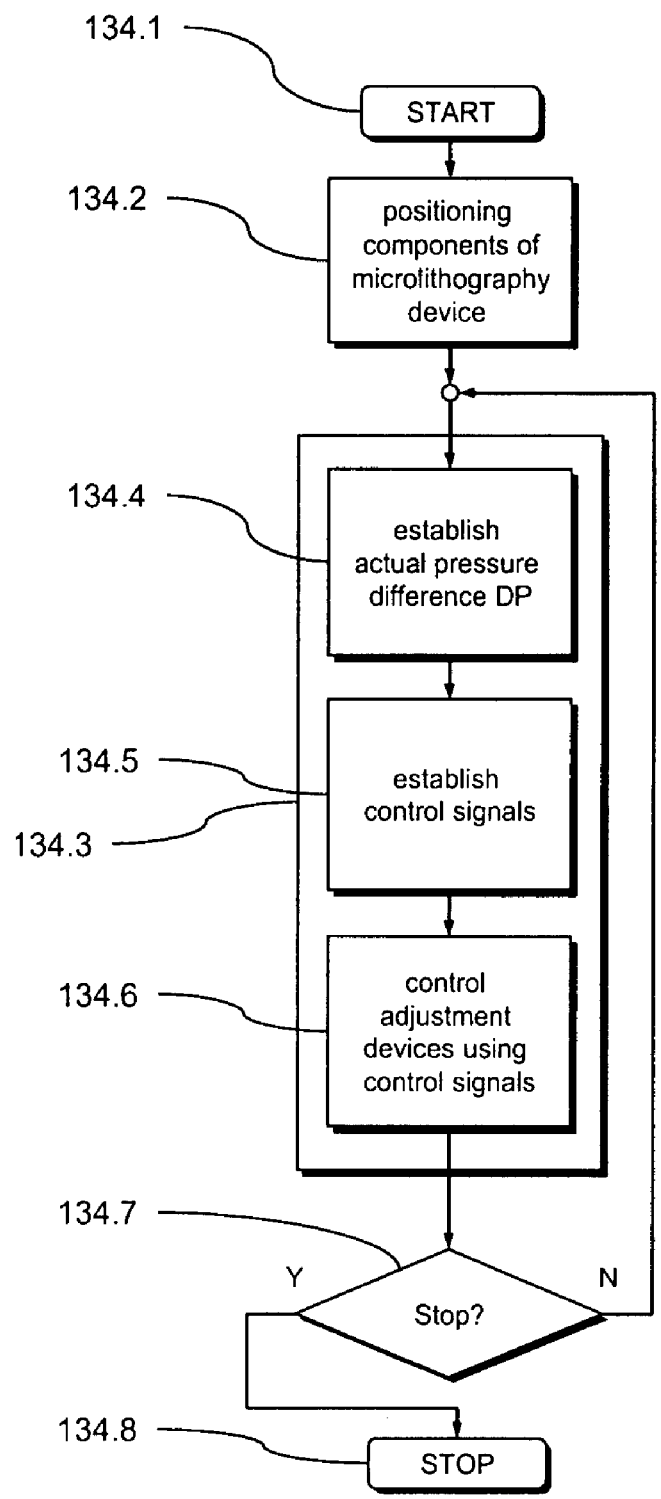
FIG. 6 is a block diagram of a preferred embodiment of the optical imaging method according to the invention which may be executed with the optical imaging device of FIG. 1.

FIG. 6 shows a block diagram of a preferred embodiment of the optical imaging method according to the invention which may be executed with the microlithography device 101.

First, in a step 134.1 execution of the method starts. In a step 134.2 the components of the microlithography device 101 are mutually positioned with respect to each other such that the configuration described above is achieved.

In a step 134.3 at least a part of the projection pattern on the mask 103.1 is projected onto the wafer 105.1 in the manner as it has been described above. In the step 134.3, in parallel to this projection, fluctuations in the pressure difference DP between the first atmosphere and the second atmosphere are reduced by means of the reduction device 115 as it has been described above.

To this end, in a step 134.4, the actual pressure difference DP between the first atmosphere and the second atmosphere is established by the control device 118 using the signals from the pressure capturing devices 117.1, 117.2 and 117.3 as it has been described above. Furthermore, eventually, further actual values representing the state of the microlithography device 101 such as the actual position, speed and acceleration of the wafer tables 105.2, 105.4 and other components (e.g. partition 130.1 etc.) are established as it has been described above.

In a step 134.5 the control device 118 establishes the control signals for the separate adjustment devices (e.g. the adjustment device 119, the adjustment device 122 and the adjustment device 125 etc.) as it has been described above.

In a step 134.6, using the established control signals, the control device 118 controls in the adjustment devices in the manner as it has been described above.

In a step 134.7 it is checked if execution of the method is to be stopped. If this is the case, execution of the method is stopped in a step 134.8. Otherwise it is jumped back to step 134.3.

In the foregoing, the present invention has been described by means of an example where the active devices 116, 121, 123 of the reduction device always capture the actual pressure situation in the first and/or second atmosphere via corresponding pressure capturing devices. It will be appreciated however that, with other embodiments of the invention, a model based control of at least one of the active devices 116, 121, 123 may be implemented.

As it has been outlined above, the pressure behavior model may have been previously established (empirically and/or theoretically) and may represent the pressure response of the microlithography device 101 in the specific region of interest (e.g. the first atmosphere, the second atmosphere etc.) as a function of the signals provided by the pressure capturing devices (e.g. devices 117.1 to 117.3, 124 etc.) mentioned above and, eventually, further actual values of operating parameters of the microlithography device 101.

With such a model based control—similar to the method disclosed in U.S. 2004/0179175 A1 (Okada)—by means of certain operating parameters of the microlithography device 101 and via the previously established and stored pressure behavior model (the control device 118 accesses), an estimation or establishment, respectively, of the pressure situation is then provided in step 134.4 of FIG. 6. The control device then uses this pressure situation established via the pressure behavior model for generating the control signals for the respective adjustment device in step 134.5 of FIG. 6. Of course, the model may as well directly provide the control signals for the respective adjustment device.

As an operating parameter of the microlithography device 101 usable as an input for the model, in principle, any operating parameter may be used that as a direct or indirect influence on the actual pressure situation within the microlithography device 101. In particular, speeds or accelerations of moving components such as, for example, the wafer tables 105.2 and 105.4 or moving optical elements may be used since these components have a direct influence on the pressure situation. The similar is valid for temperatures and flow speeds within the microlithography device 101.

Thus, for example, it may be provided that the control device 118, for controlling the first adjustment device 119 and the purging device 122, determines an actual value of the pressure difference deviation ADP using an actual value of at least one such operating parameter of the microlithography device 101 and a stored first model, wherein the first model is a model of the behavior of the pressure difference between the first atmosphere and the second atmosphere as a function of this at least one operating parameter (e.g. the speed or acceleration on the wafer tables 105.2 and 105.4), that has been previously established for the microlithography device 101.

Similarly, the control device 118, for controlling the second adjustment device 125, may determine an actual value of the pressure fluctuations $\Delta P2$ in the second atmosphere using an actual value of at least one such operating parameter of the microlithography device 101 and a stored second model. Here as well, the second model may be a model of the behavior of the pressure fluctuations in the second atmosphere as a function of this at least one operating parameter (e.g. the speed or acceleration on the wafer tables 105.2 and 105.4), that has been previously established for the microlithography device 101.

Second Embodiment

In the foregoing, the invention has been described by means of an example where a part of the last lens element 109 is immersed in an immersion medium 110.1 during exposure of the wafer 105.1. However, it will be appreciated that, the invention may also be used in the context of immersion systems wherein an immersion zone at least temporarily filled with an immersion medium (in addition or as an alternative to the immersion zone between the last lens element and the wafer) is located between two optical elements of the optical element group. Such multiple immersion systems or double immersion systems are known for example from WO 2006/080212 A1, WO 2004/019128 A2, WO 2006/051689 A1, WO 2006/126522 A1, WO 2006/121008 A1 and U.S. Pat. No. 7,180,572 B1, the entire disclosure of all of which is included herein by reference.

Thus, in the following a second preferred embodiment of the microlithography device 101 implementing such a double immersion system will be described with reference to FIGS. 7 and 8.

Figure 7:
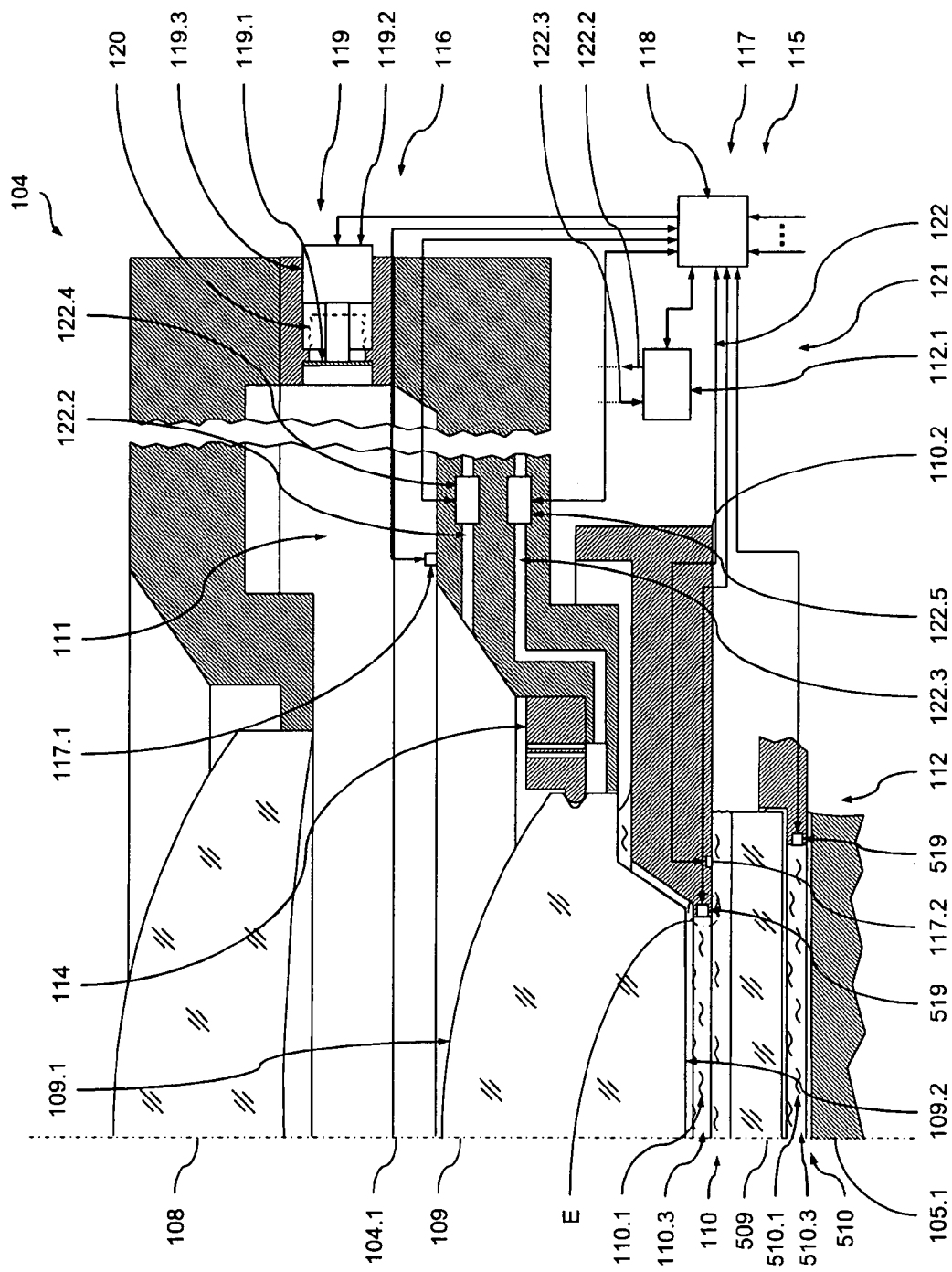
FIG. 7 is a schematic representation of a further preferred embodiment of the optical imaging device according to the invention using which a further preferred embodiment of the optical imaging method according to the invention may be executed.

FIG. 7, in a view corresponding to the view of FIG. 2, schematically shows such a double immersion system which may be used in a second embodiment of the microlithography device 101. This second embodiment of the microlithography device 101, in its design and functionality largely corresponds to the embodiment of FIGS. 1 and 2 such that it is here mainly referred to the explanations given above. In particular, identical parts have been given identical reference numbers.

One difference of the embodiment of FIG. 7 with respect to the embodiment of FIG. 2 lies within the fact that the lens element 109 is not located immediately adjacent to the wafer 105.1 but adjacent to a further optical element in the form of a lens element 509 located between the lens element 109 and the wafer 105.1. The first immersion zone 110 is located between the lens element 109 and the lens element 509 while a further, second immersion zone 510 filled with a further, second immersion medium 510.1 is located between the further lens element 509 and the wafer 105.1.

A second difference of the embodiment of FIG. 7 with respect to the embodiment of FIG. 2 lies within the fact that the reduction device 115 further comprises two identical adjustment devices 519. The adjustment devices 519 are arranged within the respective immersion frame 110.2 and 510.2, respectively, and (under the control of the control device 118) act on the respective immersion medium 110.1 and 510.1, respectively.

Figure 8:
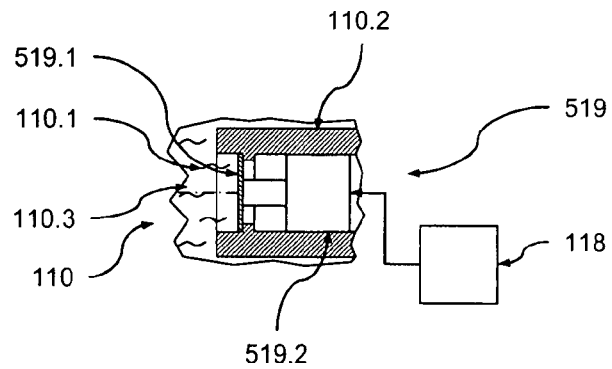
FIG. 8 is a schematic partial section of a part (detail E) of the imaging device of FIG. 7.

As can be seen from FIG. 8 showing (as an example) and the adjustment device 519 located in the first immersion zone 110, the adjustment device 519 is designed in a manner similar to the first adjustment device 119. The adjustment device 519 comprises a membrane 519.1 contacting the immersion medium 110.1 and being sealingly connected to the immersion frame 110.2 at its outer circumference. The membrane 519.1 delimits the space 110.3 receiving the immersion medium 110.1 and forming part of the second space 112. The membrane 519.1 is connected to a linearly acting actuation device 519.2 by which the direction and the degree of the curvature of the membrane 519.1 and, hence, the volume of the space receiving the immersion medium 110.1 may be adjusted.

In the embodiment shown in FIGS. 7 and 8, the membrane 519.1 is made of a sheet of sufficiently compliant metal. However, it will be appreciated that, with other embodiments of the invention, compliance other membrane may be provided by other means, in particular via a suitable geometry, e.g. an undulating geometry. Furthermore, arbitrary other suitable materials or material combinations may be used for the membrane. For example, polymeric materials such as, for example, fluoropolymers (e.g. the fluoropolymers sold by DuPont under the name Viton®) may be used for the membrane.

As it has been outlined above in the context of the first embodiment, the fourth pressure capturing device 124.1 comprises one or more suitable pressure sensors capturing (with sufficient temporal and spatial resolution) the frequency and the amplitude of fluctuations of the second pressure P2, i.e. first pressure waves, in the second space 112 and provide corresponding signals to control device 118 connected thereto.

From the signals of the fourth pressure capturing device 124.1 and, eventually, (if present in combination) the signals from the third pressure capturing device 117.3 (as it has been described above), the control device 118 establishes the frequency and the amplitude of fluctuations of the pressure P2, i.e. first pressure waves, within the second space 112 and generates therefrom corresponding second control signals for the adjustment device 519. As a function of these control signals, the adjustment device 519 generates second pressure waves in the immersion medium 110.1 received in the space 110.3. The control device 118 generates these control signals in such a manner that the second pressure waves in the immersion medium 110.1 generated by the adjustment device 519 interfere with the first pressure waves in such a manner that the pressure waves resulting from the interference at least have a lower amplitude. In the ideal case, the first and second pressure waves substantially eliminate each other.

It will be appreciated that the control loop comprising the adjustment device 519 provides a control bandwidth similar to the one of the loop comprising the first adjustment device 119. Thus, in case of counteracting periodical pressure disturbances a control bandwidth of several 100 Hz is necessary and easily achieved. In case of counteracting non-periodical pressure disturbances a control bandwidth of several kHz may eventually be necessary. Thus, if need be, the adjustment device 519 with the membrane design may be replaced by an adjustment device having one of the designs with a bellows and a piston, respectively, as they have been described above in the context of FIGS. 4B and 4C and which easily achieves such an increased control bandwidth. In particular, due to the very low compressibility of the immersion medium 110.1 very small excursions of the membrane 519.1 are required to generate considerable second pressure waves within the immersion medium 110.1. Thus, a very small and compact design of the adjustment device 519 may be achieved.

The above also applies to the design and control of the adjustment device 519 contacting the second immersion zone 510. It will be appreciated that, of course, the control device 118, when generating the control signals for the respective adjustment device 519, takes into account the action of the adjustment device 519, i.e. the respective second pressure waves generated within the respective immersion medium 110.1 and 510.1. Of course, here again, a model based control as it has been outlined above may be used by the control device 118.

The immersion medium 110.1 may be identical with or different from the immersion medium 510.1. Any suitable immersion medium may be used. Examples of such immersion media are heavy water or heavy oxygen water such as $D_2O$, $D_2O^*$, $H_2O^*$, wherein $O^*$ may comprise the isotopes $O^{16}$, $O^{17}$ and $O^{18}$. These immersion media may be mixed in an arbitrary ratio in order to achieve a desired refractive index in the respective immersion zone 110 and 610, respectively, and/or in order to achieve a desired relation between the refractive indices of the two immersion media and/or a desired relation between the refractive indices of the optical elements 109, 709 and one or both of the immersion media 110.1, 710.1. Corresponding examples and values of refractive indices for such mixtures are given in US 2006/092533 A1, US 2006/066926 A1 and WO 2005/106589 A1, the entire disclosure of each of which is incorporated herein by reference.

Third Embodiment

Figure 9:
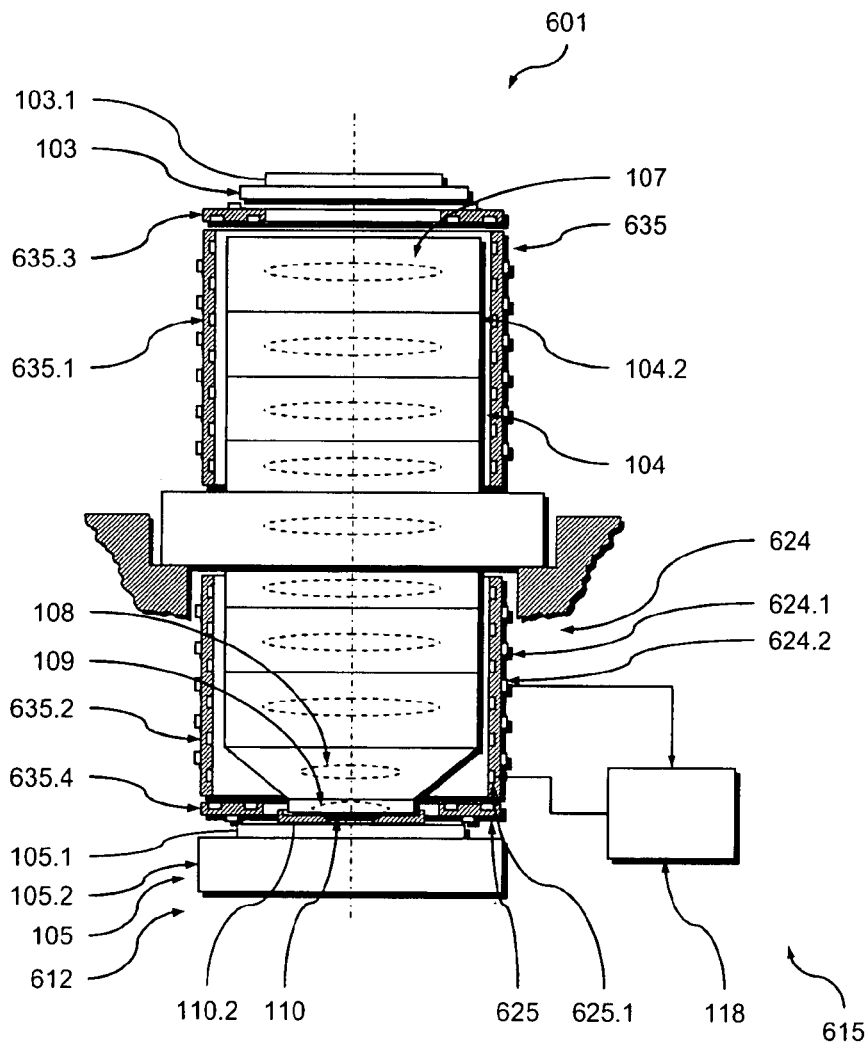
FIG. 9 is a schematic representation of a further preferred embodiment of the optical imaging device according to the invention using which a further preferred embodiment of the optical imaging method according to the invention may be executed.

In the following, a third preferred embodiment of the optical imaging device for microlithography according to the invention will be described with reference to the FIG. 9. FIG. 9, in a view corresponding to the view of FIG. 1, schematically shows a part of such a microlithography device 601 operating with light in the UV range having a wavelength of 193 nm (the illumination system 102 being not shown in FIG. 9). This third embodiment of the microlithography device 601, in its design and functionality largely corresponds to the embodiment of FIG. 1 such that it is here mainly referred to the explanations given above. In particular, identical parts have been given identical reference numbers and, with respect to these parts, reference is made to the explanations given above in the context of the first embodiment.

As mentioned above in the context of the first embodiment, fluctuations in the actual pressure difference DP between the first atmosphere (within the objective 104) and the second atmosphere (surrounding the objective 104), i.e. between the first pressure P1 and the second pressure P2 (DP=P1−P2), cause an alteration in the forces acting on the last lens element 109 in the direction of the optical axis 104.1 and, thus, cause (depending on the rigidity of the holding elements 114 connecting the last lens element 109 to the housing 104.2) a corresponding shift of the last lens element in the direction of the optical axis 104.1. This shift of the last lens element 109, in turn, causes an imaging error of corresponding magnitude.

Furthermore, such fluctuations in the actual pressure difference DP may also cause a vibration excitation of further parts of the objective 104, in particular of other optical elements of the optical element group 107 leading to further imaging errors of corresponding magnitude.

As had been explained above, the fluctuations in the actual pressure difference DP between the first atmosphere in the second atmosphere may stem from different sources such as motion of the first and second wafer table 105.2, 105.4, active adjustment of the optical elements of the optical element group 107, temperature changes or flow processes, opening and closing of doors of the facility, turning on and/or off air showers in the cleanroom, flying by of a jet airplane or the like etc.

In order to at least reduce such imaging errors due to dynamic temporal fluctuations in the actual pressure difference DP between the first atmosphere and the second atmosphere there is again provided a reduction device 615 acting directly on the cause of these imaging errors, namely by at least reducing the dynamic fluctuations in the actual pressure difference between the first atmosphere in the second atmosphere. In the present example, the reduction device 615 may largely corresponds to the reduction device 115 as it had been described above. The reduction device 615 may again comprise (in an arbitrary combination) the passive devices (126, 127, 128, 130, 132) as well as the active devices (116, 121, 129), that have been explained in detail in the context of the first and second embodiment.

The difference of the (third) embodiment of FIG. 9 with respect to the (first) embodiment of FIG. 1 lies within the fact that the reduction device 615 comprises a further active device 623. The active device 623 comprises a second capturing device 624, the control device 118, a second adjustment device 625 and an adjacent structure in the form of a shell structure 635 supporting parts of the second capturing device 624 and the second adjustment device 625.

The objective 104 is surrounded by the shell structure 635 that is located between the mask device 103 and the substrate device 105 (both described above in the context of the first embodiment). The shell structure 635 comprises a substantially tubular first shell part 635.1 and a substantially tubular second shell part 635.2 each of both being spaced radially (i.e. in the direction transverse to the optical axis 104.1) from the outer surface of the objective 104 and enveloping a part of the objective 104 in its circumferential direction. The shell structure 635 further comprises a substantially planar third shell part 635.3 and a substantially planar fourth shell part 635.4 each of both being spaced axially (i.e. in the direction of the optical axis 104.1) from the outer surface of the objective 104 and shielding an end of the objective 104 with respect to the mask device 103 and the substrate device 105, respectively.

It will be appreciated that, with other embodiments of the invention, any one or some of the first to fourth shell parts may be omitted as well as further shell parts may be added. Furthermore, some or all of the shell parts of the shell structure may be combined and formed as integral parts. Furthermore, the shell parts (in particular the tubular shell parts) do not have to be closed wall elements. Rather, at least section wise, any desired and suitable type of wall structure may be chosen, such as e.g. a perforated or grid like wall structure.

The second capturing device 624 captures pressure fluctuations in the second atmosphere, i.e. the pressure deviations $\Delta P2$ in the second atmosphere from a setpoint pressure P2S ($\Delta P2=P2-P2S$). To this end, the second capturing device 624 comprises a fourth pressure capturing device 624.1 capturing the pressure distribution P2 in the second space 112 (surrounding the objective 104).

The fourth pressure capturing device 624.1 comprises a plurality of suitable pressure sensors 624.2 located on the outer surface (facing away from the objective 104) of the shell parts 635.1 to 635.4 and capturing (with sufficient temporal and spatial resolution) the frequency and the amplitude of fluctuations of the second pressure P2, i.e. first pressure waves, in the second space 112 and provide corresponding signals to the control device 118 connected thereto.

The pressure sensors 624.2 may be elements of any suitable design to provide such signals to the control device 118. An arbitrary working principle may be used (alone or in arbitrary combination with other such working principles). For example, any working principle transferring a motion of a surface into corresponding signals may be used. In particular, microphones may be used as pressure sensors.

The pressure sensors 624.2 may be arranged in any suitable manner in order to provide the desired resolution of the pressure fluctuation detection. Preferably, the pressure sensors 624.2 are arranged in the manner of an array on the respective shell part 635.1 to 635.4.

Furthermore, it will be appreciated that, (in addition or as an alternative) at least some of the pressure sensors may be arranged integrated within the respective shell part and/or on the inner surface (facing the objective 104) of the respective shell part.

It will be appreciated that the second pressure capturing device 117.2 described above may also be a component of the fourth pressure capturing device 624.1. Thus, via the fourth pressure capturing device 624.1, first pressure waves may be detected resulting from the motion of at least one of the two wafer tables 105.2, 105.4.

It will be appreciated that, with certain embodiments of the invention, the pressure sensors 624.2 may capture the pressure fluctuations in the second atmosphere in an indirect way by detecting the motion and/or deformation of the respective shell part which results (at least in part) of such pressure fluctuations in the second atmosphere. In such a case, given a suitable detection of the mechanical disturbances introduced into the respective shell part via its mechanical support structure (not shown in further detail in FIG. 9), the pressure fluctuations in the second atmosphere may be reliably determined from the motion and/or deformation of the respective shell part captured via these (indirect) pressure sensors 624.2.

The fourth pressure capturing device 624.1, among others, serves to capture non-periodic pressure fluctuations resulting from random pressure events (as they have been outlined above) and propagating towards the objective 104, in particular, towards the last lens element 109. Given a defined location of the pressure sensors 624.2 in relation to each other and in relation to the objective 104 (in particular, to the last lens element 109) the signals from the fourth pressure capturing device 624.1 may be used to establish the speed and direction of propagation of a pressure event and, thus, to establish the point in time when and to which extent a detected pressure event is going to reach the region of the objective 104 (in particular, the region of the last lens element 109).

To this end, eventually, the control device 118 may again use a stored pressure behavior model of the microlithography device 601. The pressure behavior model may have been previously established (empirically and/or theoretically) and, among others, may represent the pressure response of the microlithography device 101 in the region of the objective 104 (in particular, the region of the last lens element 109) as a function of the signals provided by the fourth pressure capturing device 624.1 and, eventually, further actual values of operating parameters of the microlithography device 601.

The second adjustment device 625 comprises a plurality of pressure wave generators 625.1 generating (with sufficient temporal and spatial resolution) second pressure waves interfering with the first pressure waves captured via the fourth pressure capturing device 624.1.

The pressure wave generators 625.1 are located on the inner surface (facing the objective 104) of the shell parts 635.1 to 635.4 and generate (under the control of the control device 118) the second pressure waves at the suitable frequency and amplitude. The pressure wave generators 625.1 may be elements of any suitable design to provide such second pressure waves within the second space 112. An arbitrary working principle (electric, fluidic etc.) generating a motion of a surface introducing such second pressure waves into the second atmosphere may be chosen (alone or in arbitrary combination with other such working principles).

For example, one or a plurality of layer(s) of piezoelectric and/or electrostrictive and/or magnetostrictive material(s) may be used for providing a motion at a surface of the respective shell part 635.1 to 635.4 to introduce such second pressure waves into the second atmosphere. In particular, foils, stacks or layers of such materials may be applied to (at least parts of) the surface of the respective shell part 635.1 to 635.4. In other embodiments loudspeakers may be used as pressure wave generators.

Furthermore, the pressure wave generators 625.1 may be elements supported separately from the respective shell part 635.1 to 635.4 but connected to the latter via a suitable mechanical connection (e.g. via suitable gear devices, leverages, struts etc.) for providing a desired motion at a surface of the respective shell part 635.1 to 635.4.

It will be appreciated that the pressure wave generators 625.1 do not necessarily have to be located at the surface of the respective shell part 635.1 to 635.4. Rather it is sufficient that they introduce suitable deformation and/or motion into the respective shell part 635.1 to 635.4 to provide a suitable motion at a surface of the respective shell part 635.1 to 635.4.

The pressure wave generators 625.1 may be arranged in any suitable manner in order to provide the desired second pressure waves. Preferably, the pressure wave generators 625.1 are arranged in the manner of an array on the inner side (facing the objective 104) of the respective shell part 635.1 to 635.4. However, it will be appreciated that, (in addition or as an alternative) at least some of the pressure wave generators 625.1 may be arranged integrated within the respective shell part and/or on the outer surface (facing away from the objective 104) of the respective shell part.

From the signals of the fourth pressure capturing device 624.1 and, eventually, (if present in combination) the signals from the third pressure capturing device 117.3, the control device 118 establishes the frequency and the amplitude of fluctuations of the pressure P2 within the second space 112 and generates therefrom corresponding second control signals for the second adjustment device 625. As a function of the second control signals, the pressure wave generators 625.1 of the second adjustment device 625 generate a suitable motion at a surface of the respective shell part 635.1 to 635.4 and, consequently, second pressure waves in the second space 112. The control device 118 generates the second control signals in such a manner that the second pressure waves generated by the second adjustment device 625 interfere with the first pressure waves in such a manner that the pressure waves resulting from the interference at least have a lower amplitude. In the ideal case, the first and second pressure waves substantially eliminate each other.

In other words, via the active device 623, in an advantageous manner propagation of pressure disturbances within the second atmosphere towards the objective 104 and, in particular, the last lens element 109 are actively hindered or even prevented, respectively, such and that there are no imaging errors resulting from such pressure disturbances. It will be appreciated that, with other embodiments of the invention, similar devices may also be provided and acting, respectively, in the first space 111. Furthermore, it will be appreciated that the control device 118 may control the motions of the two wafer tables 105.2 and 105.6 in a manner coordinated such that the respective first and second pressure waves resulting therefrom interfere with each other in such a manner that the pressure waves resulting from this interference at least have a lower amplitude. In the ideal case, the first and second pressure waves substantially eliminate each other.

It will be appreciated that the optical imaging method according to the invention as it has been described above in the context of FIG. 6 may be executed with the microlithography device 601. Thus, in this respect it is here referred only to the explanations given above.

It will be further appreciated that the pressure sensors and the pressure wave generators, with other embodiments of the invention, may also be located at different support structures (e.g. at separate shell structures).

In the foregoing, the present invention has been described by means of an example where the active devices 116, 121, 623 of the reduction device always capture the actual pressure situation in the first and/or second atmosphere via corresponding pressure capturing devices. It will be appreciated however that, with other embodiments of the invention, a model based control of at least one of the active devices 116, 121, 623 may be implemented.

As it has been outlined above, the pressure behavior model may have been previously established (empirically and/or theoretically) and may represent the pressure response of the microlithography device 601 in the specific region of interest (e.g. the first atmosphere, the second atmosphere etc.) as a function of the signals provided by the pressure capturing devices (e.g. devices 117.1 to 117.3, 124 etc.) mentioned above and, eventually, further actual values of operating parameters of the microlithography device 101.

With such a model based control—similar to the method disclosed in US 2004/0179175 A1 (Okada)—by means of certain operating parameters of the microlithography device 601 and via the previously established and stored pressure behavior model (the control device 118 accesses), an estimation or establishment, respectively, of the pressure situation is then provided in step 134.4 of FIG. 6. The control device then uses this pressure situation established via the pressure behavior model for generating the control signals for the respective adjustment device in step 134.5 of FIG. 6. Of course, the model may as well directly provide the control signals for the respective adjustment device.

As an operating parameter of the microlithography device 601 usable as an input for the model, in principle, any operating parameter may be used that as a direct or indirect influence on the actual pressure situation within the microlithography device 601. In particular, speeds or accelerations of moving components such as, for example, the wafer tables 105.2 and 105.4 or moving optical elements may be used since these components have a direct influence on the pressure situation. The similar is valid for temperatures and flow speeds within the microlithography device 601.

In particular, the control device 118, for controlling the second adjustment device 625, may determine an actual value of the pressure fluctuations $\Delta P2$ in the second atmosphere using an actual value of at least one such operating parameter of the microlithography device 601 and a stored second model. Here as well, the second model may be a model of the behavior of the pressure fluctuations in the second atmosphere as a function of this at least one operating parameter (e.g. the speed or acceleration on the wafer tables 105.2 and 105.4), that has been previously established for the microlithography device 601.

In the foregoing, examples with one single embodiment of the respective adjustment device 119, 122, 124, 519 and 625 have been described. However, it will be appreciated that, with other embodiments of the invention, a plurality of embodiments of the respective adjustment device may be provided. In particular, the embodiments of the respective adjustment device may be distributed (preferably evenly distributed) at the circumference of the associated optical element. For example, a plurality of adjustment devices 119 may be evenly distributed at the circumference of the lens element 109 of FIG. 2.

In the foregoing, the present invention has been described by means of an example where of the first and second atmosphere contact a so called last optical element or closing element that is located immediately adjacent to a substrate to be exposed. However, it will be appreciated that the invention may also be used in the context of arbitrary optical elements located within the optical element group used for the exposure.

In the foregoing, the present invention has been described by means of an example wherein the optical element group consists of refractive optical elements exclusively. However, it is to be mentioned here that the invention, in particular in the case of performing the imaging process at different wavelengths, may of course be used with optical element groups that comprise, alone or in an arbitrary combination, refractive, reflective or diffractive optical elements.

Furthermore, it is to be mentioned that, in the foregoing, the present invention has been described by means of an example in the area of microlithography. However, it will be appreciated that the present invention may also be used for any other application and imaging process, respectively.

What is claimed is:

1. An optical imaging device comprising
at least one optical element;
a first part of said optical element contacting a first atmosphere and a second part of said optical element at least temporarily contacting a second atmosphere, wherein
a reduction device is provided, said reduction device at least reducing dynamic fluctuations in a pressure difference between said first atmosphere and said second atmosphere, wherein
said reduction device comprises a control device and an adjustment device connected to said control device;
said control device is configured to determine a frequency and a first amplitude of first pressure waves within said second atmosphere,
said adjustment device, as a function of said frequency and said first amplitude of said first pressure waves as well as controlled by said control device, is configured to generate second pressure waves in said second atmosphere in such a manner that said second pressure waves and said first pressure waves interfere to form resulting pressure waves with a resulting amplitude that is one of smaller than said first amplitude and substantially zero,
a shell structure is adjacent to and at least partially surrounds at least one member selected from the group consisting of said optical element and a holding device that holds said optical element,
said adjustment device comprising at least one pressure wave generating device mechanically connected to said shell structure and configured to generate said second pressure waves,
wherein said shell structure is non-pressure tight.

2. The optical imaging device according to claim 1, wherein
said adjustment device, controlled by said control device, is configured to influence the pressure in said second atmosphere in such a manner that said pressure fluctuations in said second atmosphere are counteracted.

3. The optical imaging device according to claim 1, wherein
said control device comprises at least one sensing device—said at least one sensing device being mechanically connected to said shell structure and configured to sense a variable representative of said frequency and said first amplitude of said first pressure waves within said second atmosphere.

4. The optical imaging device according to claim 1, wherein said shell structure is a tubular structure.

5. The optical imaging device according to claim 1, wherein
said control device establishes an actual value of pressure fluctuations in said second atmosphere using an actual value of at least one operating parameter of said optical imaging device and a stored model,
said model being a model of the behavior of said pressure fluctuations in said second atmosphere as a function of said at least one operating parameter, said model being previously established for said optical imaging device,
said at least one operating parameter being a quantity influencing the pressure in said second atmosphere.

6. The optical imaging device according to claim 5, wherein
a movable component is provided, said movable component contacting said second atmosphere and
said operating parameter is one of a speed and an acceleration of said movable component.

7. The optical imaging device according to claim 1, wherein at least one of
said adjustment device comprises at least one loudspeaker, and
for determining said frequency and said first amplitude of said first pressure waves, a capturing device connected to said control device is provided for capturing said frequency and said first amplitude of said first pressure waves, said capturing device comprising at least one microphone.

8. The optical imaging device according to claim 1, wherein
at least one holding device is provided, said holding device holding said optical element and comprising at least one actuator for altering the position of said optical element, and
said actuator is controlled by said control device for reducing fluctuations in the pressure difference between said first atmosphere and said second atmosphere via an alteration of the position of said optical element.

9. The optical imaging device according to claim 1, wherein said reduction device reduces at least the fluctuations in the pressure difference between said first atmosphere and said second atmosphere lying in a frequency range within which fluctuations in the pressure difference between said first atmosphere and said second atmosphere have a non-negligible effect on imaging quality achievable with said optical imaging device.

10. The optical imaging device according to claim 1, wherein said second part of said optical element, during operation of said optical imaging device, at least temporarily contacts a liquid medium.

11. The optical imaging device according to claim 1, wherein
a mask device for receiving a mask comprising a projection pattern is provided,
as a movable component, a substrate device for receiving a substrate is provided, said substrate device contacting said second atmosphere and being movable in at least one direction of motion,
an optical element group is provided, said optical element group being adapted to image said projection pattern associated to said optical element group onto said substrate being associated to said optical element group.
said optical element being one of an element of said optical element group and the last optical element of said optical element group located adjacent to said substrate during operation of said optical imaging device.

12. The optical imaging device according to claim 1, wherein said shell structure comprises a perforated wall structure.

13. The optical imaging device according to claim 1, wherein said shell structure comprises a grid wall structure.

14. An optical imaging method, wherein
a projection pattern is imaged onto a substrate using an optical imaging device;
a first part of an optical element of said optical imaging device contacting a first atmosphere and a second part of said optical element at least temporarily contacting a second atmosphere;
for reducing an imaging error occurring during imaging said projection pattern onto said substrate and resulting from dynamic fluctuations in a pressure difference between said first atmosphere and said second atmosphere, at least a reduction of said dynamic fluctuations in said pressure difference between said first atmosphere and said second atmosphere being provided, wherein reducing the imaging error comprises:
determining the frequency and the first amplitude of first pressure waves within said second atmosphere,
as a function of said frequency and said first amplitude of said first pressure waves, generating second pressure waves in said second atmosphere so that said second pressure waves and said first pressure waves interfere to form resulting pressure waves with a resulting amplitude,
said resulting amplitude being one of smaller than said first amplitude and substantially zero,
said second pressure waves being generated via a shell structure that is adjacent to and at least partially surrounding at least one of said optical element and a holding device holding said optical element,
wherein said shell structure is non-pressure tight.

15. The optical imaging method according to claim 14, wherein
pressure fluctuations in said second atmosphere are one of determined and captured and
the pressure in said second atmosphere is influenced in such a manner that said pressure fluctuations in said second atmosphere are counteracted.

16. The optical imaging method according to claim 14, wherein
an actual value of pressure fluctuations in said second atmosphere is established using an actual value of at least one operating parameter of said optical imaging device and a stored model,
said model being a model of the behavior of said pressure fluctuations in said second atmosphere as a function of said at least one operating parameter, said model being previously established for said optical imaging device,
said at least one operating parameter, in particular, being a quantity influencing the pressure in said second atmosphere.

17. The optical imaging method according to claim 16, wherein
said optical imaging device comprises a movable component, said movable component contacting said second atmosphere and
said operating parameter is a speed or an acceleration of said movable component.

18. The optical imaging method according to claim 14, wherein at least the fluctuations in the pressure difference between said first atmosphere and said second atmosphere lying in a frequency range within which fluctuations in the pressure difference between said first atmosphere and said second atmosphere have a non-negligible effect on imaging quality achievable with said optical imaging device are reduced.

19. The optical imaging method according to claim 14, wherein said second part of said optical element, during operation of said optical imaging device, at least temporarily contacts a liquid medium.

20. The optical imaging method according to claim 14, wherein said shell structure is a tubular structure.

21. The optical imaging method according to claim 14, wherein said shell structure comprises a perforated wall structure.

22. The optical imaging method according to claim 14, wherein said shell structure comprises a grid wall structure.

* * * * *

UNITED STATES PATENT AND TRADEMARK OFFICE
CERTIFICATE OF CORRECTION

PATENT NO. : 8,027,023 B2
APPLICATION NO. : 11/985884
DATED : September 27, 2011
INVENTOR(S) : Stefan Hembacher It is certified that error appears in the above-identified patent and that said Letters Patent is hereby corrected as shown below:

Column 10,
Line 1, Delete "the . space" and insert --the first space--

Column 10,
Line 62, Delete "124.1" and insert --124.1.--

Column 13,
Line 55, Delete "117.1,117.2" and insert --117.1, 117.2--

Column 14,
Line 45, Delete "ADP" and insert --ΔDP--

Column 19,
Line 13, Delete "624.2" and insert --624.2.--

Column 22,
Line 48-49, Delete "device—said" and insert --device; said--

Column 23,
Line 48, Delete "group." and insert --group,--

Signed and Sealed this
Tenth Day of January, 2012

David J. Kappos
*Director of the United States Patent and Trademark Office*